US009753112B2

(12) United States Patent
Serra

(10) Patent No.: US 9,753,112 B2
(45) Date of Patent: Sep. 5, 2017

(54) MAGNETIC RESONANCE IMAGING METHOD AND DEVICE

(71) Applicant: ESAOTE S.p.A., Milan (IT)

(72) Inventor: Andrea Serra, Genoa (IT)

(73) Assignee: ESAOTE S.P.A., Genoa (IT)

( * ) Notice: Subject to any disclaimer, the term of this patent is extended or adjusted under 35 U.S.C. 154(b) by 1138 days.

(21) Appl. No.: 13/777,427

(22) Filed: Feb. 26, 2013

(65) Prior Publication Data

US 2013/0221963 A1 Aug. 29, 2013

(30) Foreign Application Priority Data

Feb. 27, 2012 (IT) .............................. GE2012A0022

(51) Int. Cl.
| | | |
|---|---|---|
| *G01R 33/56* | (2006.01) | |
| *G01R 33/565* | (2006.01) | |
| *G01R 33/48* | (2006.01) | |
| *G01R 33/561* | (2006.01) | |

(52) U.S. Cl.
CPC ....... *G01R 33/56* (2013.01); *G01R 33/56554* (2013.01); *G01R 33/482* (2013.01); *G01R 33/5617* (2013.01)

(58) Field of Classification Search
CPC .. G01R 33/482; G01R 33/56; G01R 33/5617; G01R 33/56554
USPC .......................... 324/307, 309, 318; 382/131
See application file for complete search history.

(56) References Cited

U.S. PATENT DOCUMENTS

| 5,119,026 A | 6/1992 | Iino et al. |
| 5,545,990 A | 8/1996 | Kiefer et al. |
| 6,068,595 A * | 5/2000 | Miyazaki ........... G01R 33/5635 324/309 |

(Continued)

FOREIGN PATENT DOCUMENTS

EP 1 653 244 A1 5/2006

OTHER PUBLICATIONS

Extended European Search Report issued Apr. 29, 2013, by the European Patent Office in corresponding European Patent Application No. 13156081.5. (9 pages).

(Continued)

*Primary Examiner* — Melissa Koval
*Assistant Examiner* — Rishi Patel
(74) *Attorney, Agent, or Firm* — Buchanan Ingersoll & Rooney PC

(57) ABSTRACT

Magnetic resonance imaging method and device, preferably using T2-weighted Fast Spin Echo (FSE) sequences, wherein a first set of magnetic resonance signals corresponding to predetermined phase-encoding gradients and at least one second set of received magnetic resonance signals, corresponding to further predetermined phase-encoding gradients, are acquired from the body under examination, using multi-echo sequences, such that echoes with the same echo index are assigned to different phase-encoding gradients, said first set and said at least one second set being entered into at least two corresponding k-space matrices, and the at least two k-space matrices being combined into a single k-space matrix from which an image is generated, wherein each k-space matrix is incompletely filled such that, for the same phase encoding gradients, one matrix contains the higher-intensity received signals, and at least another matrix contains no signal.

12 Claims, 24 Drawing Sheets

(56) References Cited

U.S. PATENT DOCUMENTS

| | | | | |
|---|---|---|---|---|
| 6,154,029 A | * | 11/2000 | Miyamoto | G01R 33/5615 324/300 |
| 7,075,299 B1 | | 7/2006 | Peters | |
| 2011/0291655 A1 | * | 12/2011 | Hamamura | G01R 33/3642 324/318 |
| 2013/0147483 A1 | * | 6/2013 | Kurokawa | G01R 33/4818 324/310 |

OTHER PUBLICATIONS

Search Report Issued on Sep. 28, 2012, by the Italian Patent Office for Application No. GE20120022.

Hamilton et al., "Crisscross MR imaging: improved resolution by averaging signals with swapped phase-encoding axes", Radiological Society of North America, Oct. 1994, vol. 193, No. 1, pp. 276-279.

\* cited by examiner

MAGNETIC RESONANCE IMAGING METHOD AND DEVICE

CROSS-REFERENCE TO RELATED APPLICATIONS:

The present application claims the priority of Italian Patent Application No. GE2012A000022, filed on Feb. 27, 2012, the entire contents of which is incorporated herein by reference.

FIELD OF THE INVENTION

The present invention relates to a Magnetic Resonance Imaging method.

BACKGROUND

In Magnetic Resonance Imaging, as well as in every imaging arrangement, image fidelity is described by an imaging technique- and system-specific transfer function, known as Point Spread Function (PSF), which may be defined as the representation of how a single point of real space is mapped in the image space.

An ideal PSF provides a perfect point, whereas any deviation from this ideal state leads to image artifacts such as blurring or ghosting. In order to avoid such problems as much as possible, the PSF shall be maintained as close as possible to the ideal state.

This result is achieved by various methods, which may be basically divided into two general classes: the methods of the first class are intended to act upon the physics of the system, by equalizing the received signals in various manners; conversely, the methods of the second class are intended to act upon k-space filling modes.

SUMMARY

The method of the present disclosure belongs to such second class, and comprises an excitation and acquisition step, in which the body under examination is permeated by a static magnetic field, and in which excitation sequences comprising trains of radio-frequency pulses are applied to the body under examination by application of phase and frequency encoding gradients and magnetic resonance signals are received from the body under examination;

an image reconstruction step, in which said received magnetic resonance signals are processed for generating images by phase and frequency decoding, the images being acquired along section planes or slices of the body under examination, known as acquisition slices;

wherein a first set of magnetic resonance signals corresponding to predetermined phase-encoding gradients and at least one second set of received magnetic resonance signals, corresponding to further predetermined phase-encoding gradients, are acquired from the body under examination, using multi-echo sequences, such that echoes with the same echo index are assigned to different phase-encoding gradients, said first set and said at least one second set being entered into at least two corresponding k-space matrices, and the at least two k-space matrices being combined into a single k-space matrix from which an image is generated.

Methods of this type are widely known and used and differ by k-space encoding and/or filling strategies, and/or by combinations of the k-space matrices obtained.

Examples of these methods are described in patents U.S. Pat. No. 5,545,990 and EP1653244, in which they are used to avoid image degradation, particularly to avoid ghosting in imaging with multi-echo sequences such as Fast Spin Echo (FSE).

The FSE sequence has a first 90° RF excitation pulse, followed by a series of 180° RF refocusing pulses, for generating echoes, assigning a different phase encoding to each of them, recording signals and filling the lines of the k-space.

Phase encoding is performed by applying a gradient along the phase encoding axis before echo formation, with the same gradient being applied in reverse after the echo for magnetic spin realignment.

The amplitude of the echoes so generated, and hence the received signal, decreases with time, following spin-spin or T2 relaxation, i.e. the entropic process that describes the loss of coherence of the total magnetization components $M_x$ and $M_y$ at the end of the radio-frequency radiation.

Due to spin-spin or T2 relaxation, the FSE is affected by artifacts caused by mixing of different echoes in the same k-space, particularly because the difference among the amplitudes of the various signals that compose the different lines of the k-space adversely affects the PSF.

U.S. Pat. No. 5,545,990 discloses a method whereby pairs of echoes of successive acquisitions, with the same phase encoding and different amplitudes due to T2 relaxation, are summed and averaged. Thus, the signal so obtained is used instead of the original signals.

Patent EP1653244 discloses a similar method, in which even echoes and odd echoes are summed together to reduce ghosting caused by phase errors.

Depending on the selected k-space filling strategy, and particularly on the echoes to be placed at the center of the k-space, the matrix may be filled such that the amplitudes of the echoes form a curve similar to a sinusoidal cycle.

The use of different encoding strategies for the second image acquisition, such that the amplitudes of the echoes of the second acquisition are symmetric with respect to those of the first acquisition, i.e. similar to a sin(−x) cycle, allows averaging of the echoes with the same phase encoding, and hence homogeneization of the amplitude of echoes along the phase encoding direction, thereby improving the PSF.

The use of a double acquisition also increases the signal-to-noise ratio (SNR), which is a desired effect, especially in low field imaging apparatus.

This is because the averaging step reduces noise, and accordingly increases the SNR, as MRI noise is of electrical nature and spreads in a substantially even manner across frequencies.

Since the noise is of random nature, by averaging two or more signals, the SNR is improved.

U.S. Pat. No. 5,119,026 discloses a method in which, in view of improving the SNR, the k-space from the periphery to the center is first filled with zeros (zero-filling) and then is filled by interpolation with a smaller number of signals, then with unchanged signals, whereas the signals received in successive acquisitions are averaged at the center.

The acquired signals have the same intensity and are either averaged or not depending on phase encoding, i.e. on the position in the k-space.

Nevertheless, the above described method uses single-echo sequences, which involve very long imaging times, as they require subsequent acquisitions.

In all prior art methods, the echo averaging step requires at least two acquisitions, which involves the drawback of requiring twice the time required for signal detection.

The method of the present disclosure is aimed at substantially reducing imaging times as compared with prior art methods, while possibly obtaining an improved image resolution, using a method as described hereinbefore, in which each k-space matrix is further incompletely filled such that, for the same phase encoding gradients, one matrix contains the higher-intensity received signals, and at least another matrix contains no signal, and said single k-space matrix is generated by taking a partial average, where subsets of received signals corresponding to the same phase encoding gradients of the different sets of received signals are defined, and in at least one subset the received signals that correspond to the same phase encoding gradient of the different sets of received signals are not averaged or are averaged a smaller number of times, whereas in at least one further subset they are averaged a greater number of times.

Therefore, averaging is performed a smaller number of times in at least one subset, and a greater number of times, i.e. at least once more than the first subset, in at least another subset.

The term "number of times", when related to averaging, is intended as the number of averaged signals, which are summed together, with the sum being divided by the number of averaged signals.

When the signals are not averaged, it shall be understood that the highest intensity signal is retained. In one embodiment, a first subset comprises lower-intensity received signals among the different sets of received signals, and a second subset comprises higher-intensity received signals of at least one of the different sets of received signals, and the received signals of the first subset of the different sets of received signals and corresponding to the same phase-encoding gradient are summed up and averaged, whereas the received signals of the second subset are not averaged and the highest intensity signal.

In a preferred embodiment of the disclosure, said excitation sequences comprising trains of pulses are of Fast Spin Echo (FSE) type, particularly with T2 contrast.

In a preferred exemplary embodiment, the lowest-intensity signals are those located at the center of the k-space, and provide the required T2 contrast.

While the above method may be used with T1- or PD-weighted images, it is particularly advantageous in T2-weighted images, as the echo at the center of the k-space has a lower intensity in these images, and higher-intensity echoes, that may be left unaveraged and unchanged, are located in more peripheral areas.

Conversely, in T1- and PD-weighted images, the higher-intensity echoes are located at the center of the k-space and are left unchanged, whereas lower-intensity echoes are averaged in peripheral areas, whereby tissue contributions at the center of the k-space may be lost.

The above described method advantageously allows T2 relaxation to be used for dramatic reduction of imaging times, since the first received echoes, which have a higher amplitude and hence a higher SNR, are left unaveraged with the last received echoes, which have a lower amplitude and hence a lower SNR.

By this arrangement, the same k-space may be filled with a smaller number of echoes, and hence in a shorter time; otherwise, with the same number of echoes and the same imaging time, a larger k-space may be filled, and an echo train of N echoes, including E unaveraged echoes, fills the k-space of an echo train with (N+E) echoes.

This is allowed by the arrangement of incompletely filling the k-space, such that "holes" are provided for a multiplicity of views, i.e. such that no signal is provided at a plurality of phase encoding gradients.

The arrangement of the signals of the various sets in the k-space matrices is defined before imaging, and may be set by the user or the designer.

A signal intensity threshold may be also established, above which the signals are maintained unaveraged, i.e. are placed in a k-space matrix at "holes" or positions with no signals, corresponding to the same phase encoding gradients, as the additional one or more k-space matrices.

In the preferred embodiment, the repetition time TR is reduced and the scanning step requires a shorter time: the imaging time was found to be reduced by 30-35%.

This method can be only used with the acquisition of two different k-spaces, as described above, which in common use replace averaging and is particularly suitable for "low field" imaging apparatus.

This is because, while in "high field" imaging apparatus, the acquisition of two k-spaces is useful to reduce artifacts and the additional imaging time is a problem, in "low field" imaging apparatus, averaging is still required, and the acquisition of two k-spaces, in terms of SNR and scan times, has the same effect as averaging.

According to an improvement, a multiplication factor is applied to each received signal to obtain a substantially constant noise for all received signals, once said partial average is taken.

In the above described partial averaging step, the lower-intensity received signals are summed in pairs and averaged, whereas the higher-intensity received signals are left unaveraged. This causes considerable differences between the noise of unaveraged higher-intensity received signals, and that of averaged, lower-intensity signals.

Noise is quantified using its standard deviation $\sqrt{\langle n^2 \rangle_-}$, which may be defined as the energy associated with noise.

When signals are averaged, noise sums as a square root while signal sums linearly, whereby the SNR grows as $\sqrt{N}$, with N being the number of averages.

Since partial averaging is carried out, then the energy associated with noise is not identical throughout the lines of the k-space matrix.

The Fourier transform of this stepwise noise may add a structure to noise, which may in turn be enhanced by the presence of filters on the image. By obtaining a substantially constant noise, i.e. by equalizing noise, the noise may be prevented from being artificially added a structure between the various received signals, which structure might lead to artifacts in the reconstructed image.

In order to avoid this, all the noise in the k-space is assigned the same energy.

In order to equalize the signal noise along the phase encoding direction of the k-space a multiplication factor is applied in a different manner to the various received signals.

Signal multiplication changes both the noise and the signal, and this is a desired effect, as amplification is performed on the lower-intensity signal, i.e. the averaged signal, and hence, in addition to making the noise equal and substantially constant throughout the signals, it reduces the differences between signals and improves the PSF.

Therefore, this arrangement is particularly advantageous, in that it both provides signal intensity homogenization, thereby improving PSF, and consequently further reduces the occurrence of artifacts. Alternatively, a multiplication factor may be applied to the signals to optimize PSF, preferably based on a measurement of the artifacts of the resulting image.

In a first variant embodiment, the multiplication factor applied to these lower-intensity received signals is the reciprocal of the noise-reduction factor applied to said lower-intensity received signals after averaging, to reduce the noise intensity of the original received signals, which noise reduction is obtained by said partial average.

In a particular exemplary embodiment, the multiplication factor applied to these lower-intensity received signals is $\sqrt{n}$, where n is the number of received signals.

That is, by averaging n signals, the amplitude of the noise signal obtained is generally reduced by a reduction factor $$\frac{1}{\sqrt{n}}$$

of the amplitude of the noise components of the original signals.

For instance, if there are two averaged signals, the amplitude of the noise signal obtained is reduced by a reduction factor $$\frac{1}{\sqrt{2}},$$

whereas the SNR increases by a factor of 41%.

This is actually the increase of the SNR obtained by averaging the signals in prior art methods.

In a second variant embodiment, the multiplication factor applied to these higher-intensity received signals is the reciprocal of the noise-reduction factor applied to said lower-intensity received signals after averaging, to reduce the noise intensity of the original received signals, which noise reduction is obtained by said partial average.

In this second variant, instead of applying a multiplication factor to the averaged lower-intensity received signals to increase their intensity, the intensity of the unaveraged higher-intensity received signals is reduced, i.e. the multiplication factor provides an attenuation.

In a particular exemplary embodiment, the multiplication factor applied to these higher-intensity received signals is $$\frac{1}{\sqrt{n}},$$

where n is the number of received signals.

In a preferred variant embodiment, different multiplication factors are applied both to the higher-intensity received signals and to the lower-intensity received signals, said multiplication factors being optimized for maximization of the dynamic range without saturation.

In a preferred exemplary embodiment, two sets of received signals are acquired.

Therefore in this case, according to said first variant, a multiplication factor of $\sqrt{2}$ may be applied to the lower-intensity received signals or, according to said second variant, a multiplication factor of $$\frac{1}{\sqrt{2}}$$

may be applied to the higher-intensity received signals, or preferably the higher-intensity and lower-intensity signals are multiplied by multiplication factors that are optimized for noise equalization.

The individual signals and/or small groups of signals may be also multiplied by specially established multiplication factors.

In a further exemplary embodiment, three or more sets of received signals are acquired, and the above mentioned partial average involves an average of a preset number of received signals corresponding to the same phase-encoding gradient, which preset number of received signals changes according to the amplitude of each received signal and/or the position of each received signal in the k-space.

The multiplication factor of each signal is anyway selected with the purpose of equalizing noise and/or reducing artifacts.

Furthermore, partial averaging is selected such that:
1) the resulting signals are equalized while preferably maintaining symmetric k-space filling;
2) the SNR is increased at the center of the k-space, where the signals with a T2 contribution are smaller.

1 is useful to improve the PSF, and 2 is useful to maximize the SNR of the T2 scan.

Furthermore, a formula may be defined for combination of multiple k-spaces based on an average T2.

The disclosure also relates to a Magnetic Resonance Imaging device comprising:
means for generating a static magnetic field;
means for generating magnetic field gradients;
means for transmitting radio-frequency excitation pulses;
means for receiving magnetic resonance signals emitted from the body under examination;
means for processing such magnetic resonance signals emitted from the body under examination to generate images;
wherein said receiving means are adapted to acquire a first set of magnetic resonance signals corresponding to predetermined phase-encoding gradients and at least one second set of received magnetic resonance signals, corresponding to further predetermined phase-encoding gradients from the body under examination, such that echoes with the same echo index are assigned to different phase-encoding gradients,
said first set and said at least one second set are entered by said processing means into at least two corresponding k-space matrices, which processing means combine the at least two k-space matrices into a single k-space matrix, from which the image is generated, wherein the received signals are entered by said processing means into said matrices such that for the same phase encoding gradients, one matrix contains the higher-intensity received signals and at least another matrix contains no signal and, in order to generate the single k-space matrix, said processing means take a partial average, where the lower-intensity received signals corresponding to the same phase encoding gradient of the different sets of received signals are summed together and averaged, whereas the higher-intensity received signals are left unaveraged.

In a preferred exemplary embodiment, the above mentioned receiving means apply a multiplication factor, varied for each received signal, to obtain a substantially constant noise for all received signals, once said partial average is taken.

The above mentioned method is suitable both for 2D and 3D k-space filling.

BRIEF DESCRIPTION OF THE DRAWINGS

These and other features and advantages of the present disclosure will appear more clearly from the following description of a few embodiments, illustrated in the annexed drawings, in which.

Figure 1:
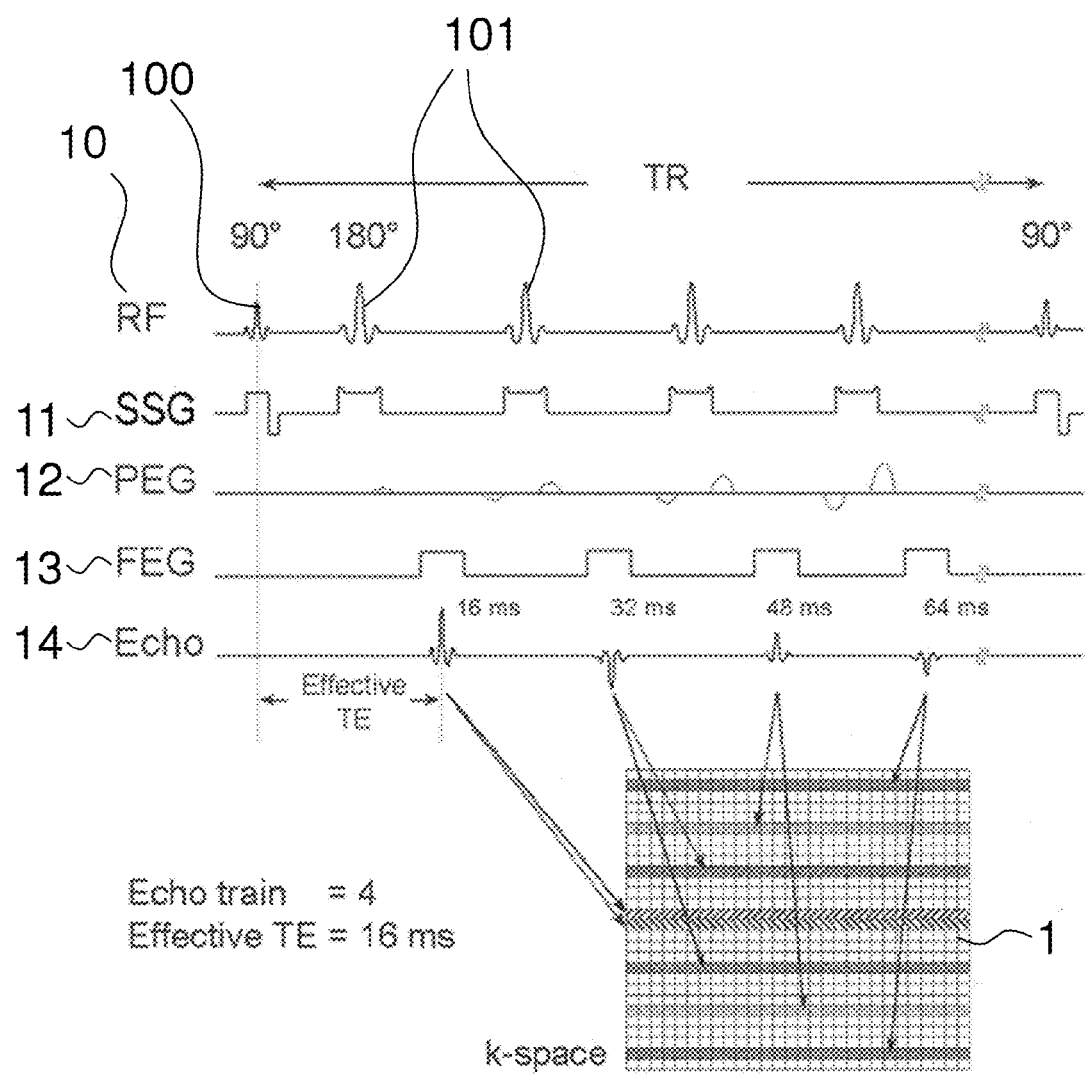
FIG. 1 shows a general diagram of the FSE sequence.

DETAILED DESCRIPTION OF THE PREFERRED EMBODIMENTS:

In a preferred exemplary embodiment, excitation sequences of FSE pulse trains are used, as shown in FIG. 1.

The FSE sequence provides emission of a train of RF excitation pulses 10, with a first 90° RF excitation pulse 100, followed by a series of 180° RF refocusing pulses 101 for generating echoes 14.

Magnetic field gradients, i.e. Slice Selection Gradients SSG 11, Phase Encoding Gradients PEG, Frequency Encoding Gradients FEG 13 are also applied to the body being examined.

As clearly shown in the figure, the application of the phase encoding gradient along the phase encoding axis before echo formation is followed by application of the same gradient in reverse, for magnetic spin realignment before the next 180° RF refocusing pulse 101.

Then, the echoes 14 so generated are recorded as received signal and are entered into a k-space matrix 1.

Figure 2:
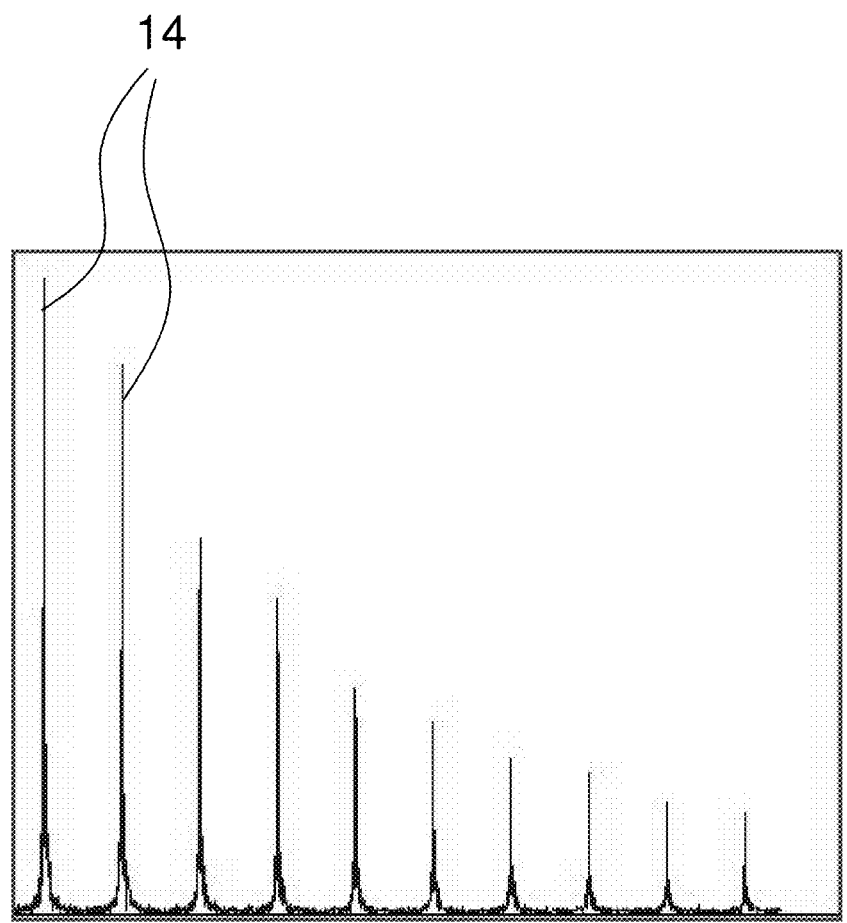
FIG. 2 shows an example of the received signal, where T2 relaxation is clearly visible.

FIG. 2 shows a received signal according to the excitation sequence FSE, comprising the echoes 14, which shows amplitude reduction with time according to spin-spin or T2 relaxation.

T2 relaxation causes an amplitude difference among the various signals that compose the various lines of the k-space and has adverse effects on the PSF, as shown in FIGS. 3a, 3b, 4a, 4b, 5a, 5b.

Figure 3A:
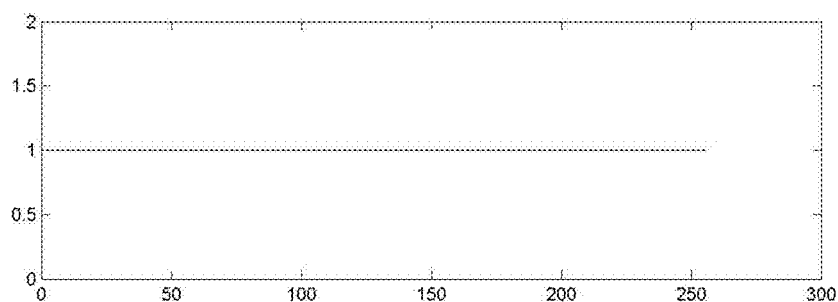
FIGS. 3a, 3b, 4a, 4b, 5a, 5b show how the PSF depends on signal modulation in the phase encoding direction.
Figure 3B:
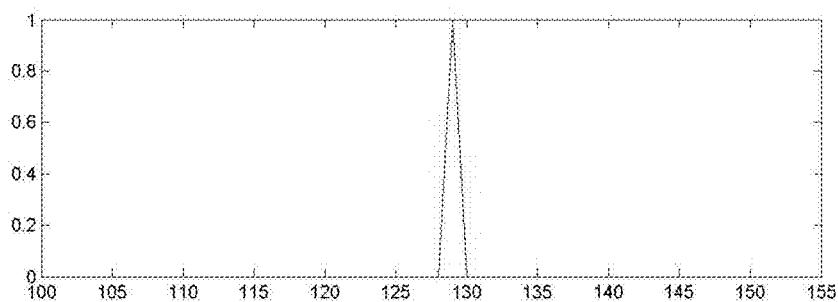

FIG. 3a shows an ideal condition of uniform amplitude of the signals in the phase encoding direction, generating a corresponding quasi-ideal PSF in FIG. 3b.

Figure 4A:
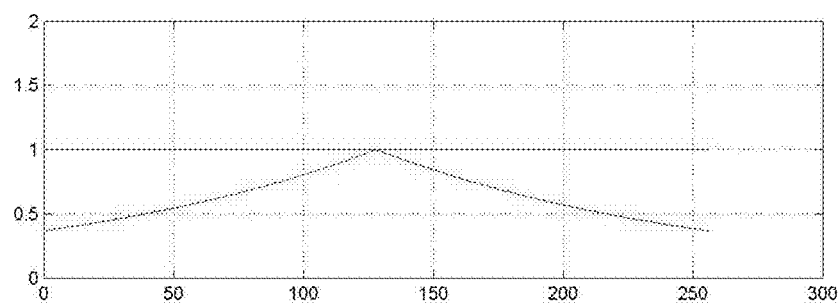
Figure 4B:
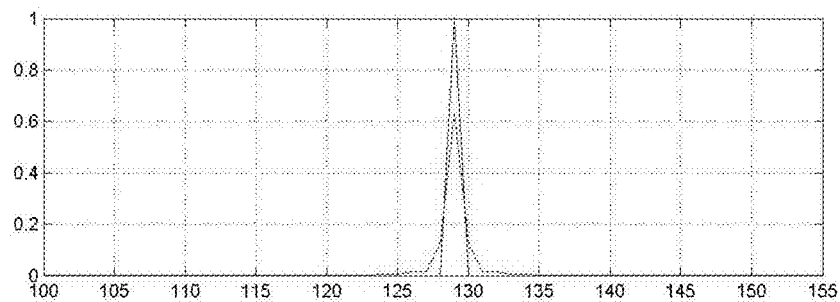

When amplitude is modulated according to FIG. 4, the corresponding PSF is changed as shown in FIG. 4b, thereby causing blurring in the image space.

Figure 5A:
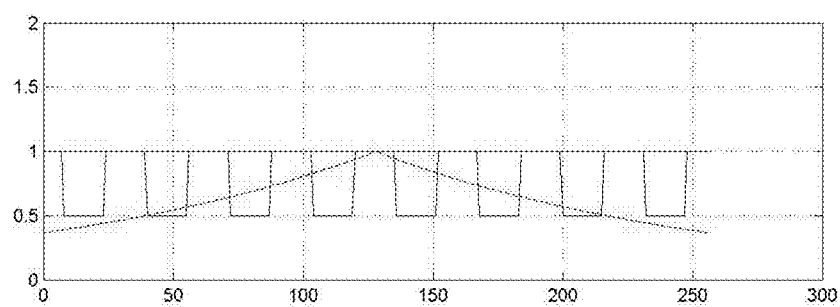
Figure 5B:
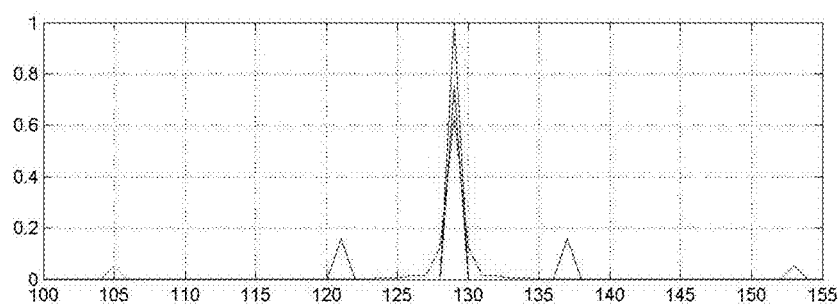

When amplitude is modulated according to FIG. 5a, the corresponding PSF is changed as shown in FIG. 4b, thereby causing ghosting in the image space.

Figure 6:
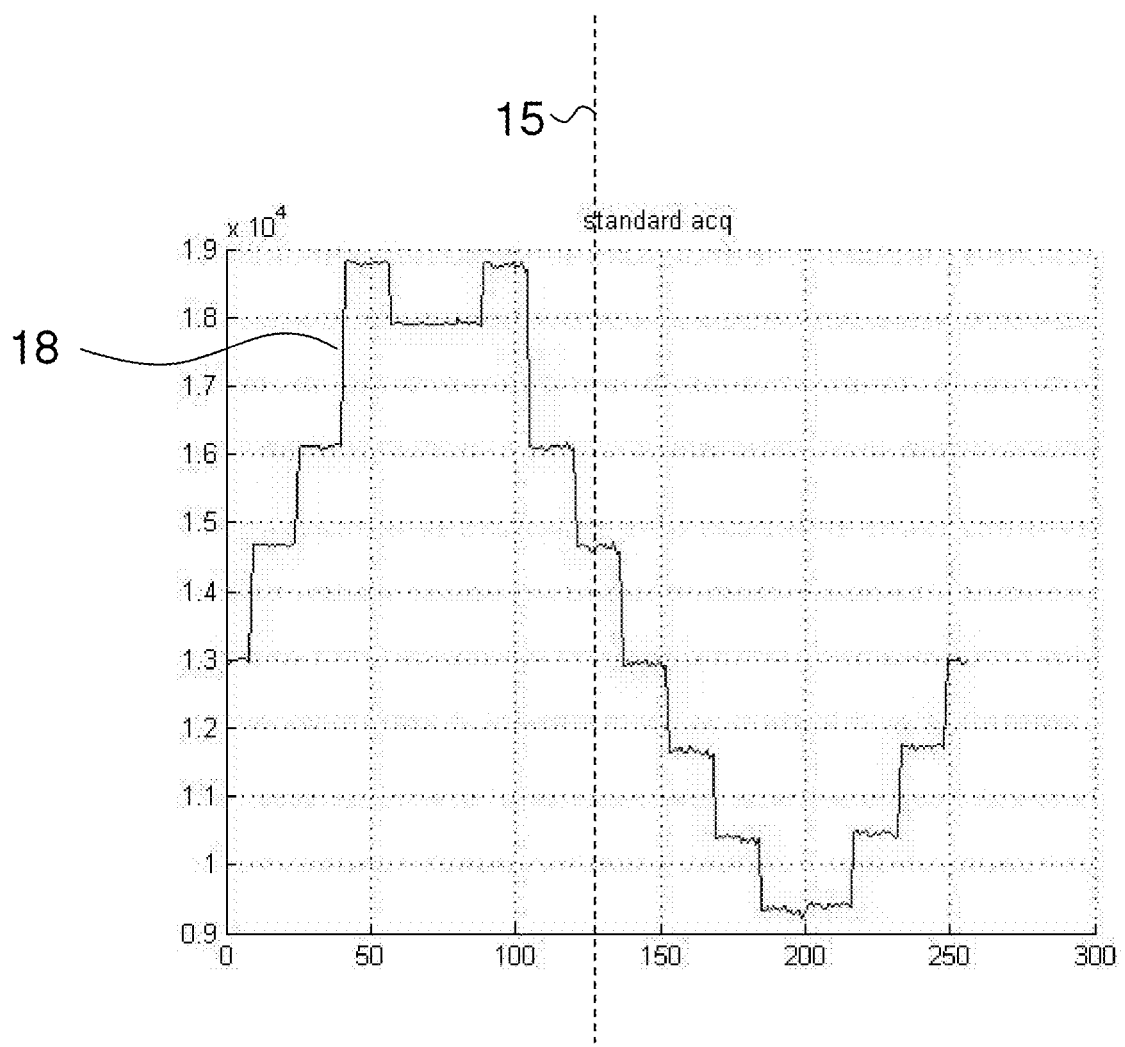
FIG. 6 shows a standard acquisition.
Figure 7:
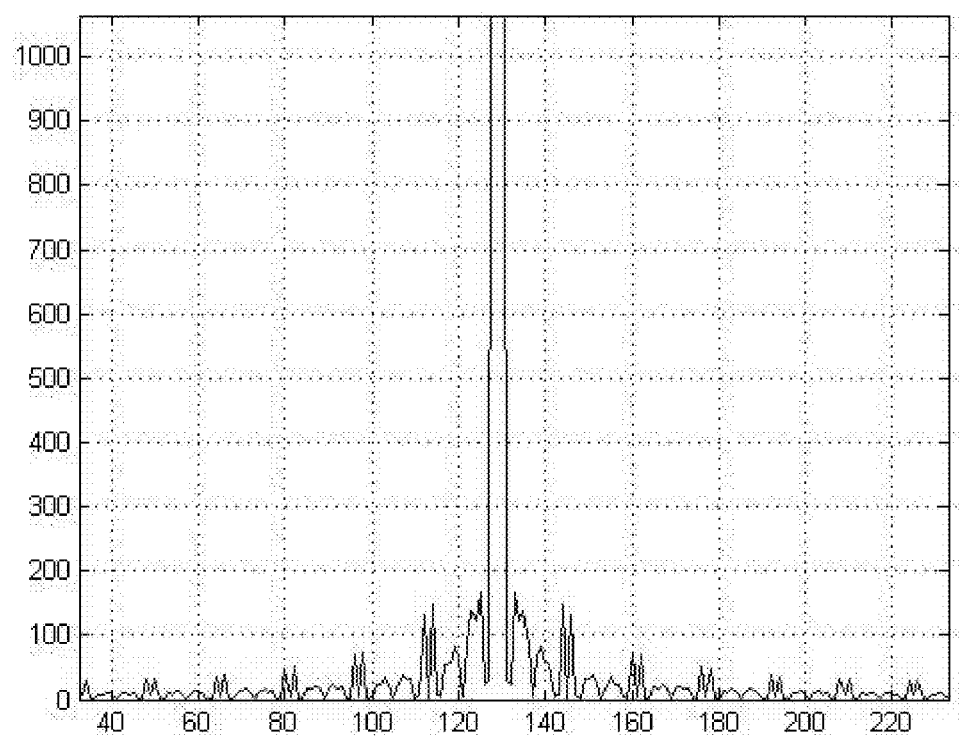
FIG. 7 shows the PSF for the acquisition of FIG. 6.

FIG. 6 shows a standard acquisition, in which the received signals 18 are placed in the k-space 1 such that the amplitudes of echoes form a sine-like curve, whose PSF is shown in FIG. 7, in which blurring and ghosting are clearly visible.

According to the prior art, a second set of signals 19 is acquired, whose amplitudes form a curve that is symmetric to that of the first acquisition with respect to the center of the k-space 15, and hence similar to a sin(-x) cycle.

Figure 8:
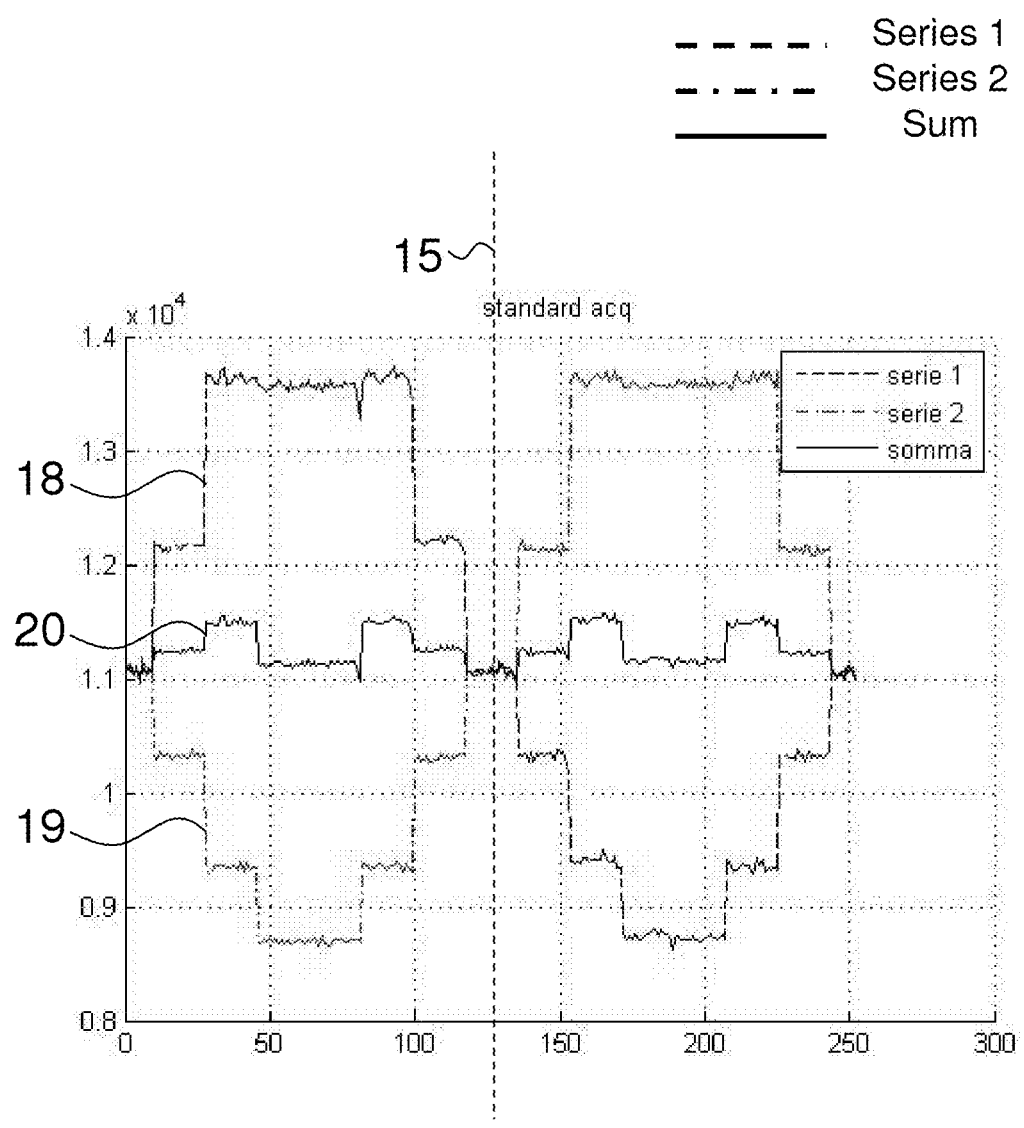
FIG. 8 shows the average of two acquisitions according to the prior art.

FIG. 8 shows the steps in which the sets of signals 18 and 19, particularly the echoes with the same phase encoding, are averaged; this averaging step results in an averaged signal 20, which provides homogenization of the amplitude of echoes along the phase-encoding direction, thereby improving the PSF.

Figure 9A:
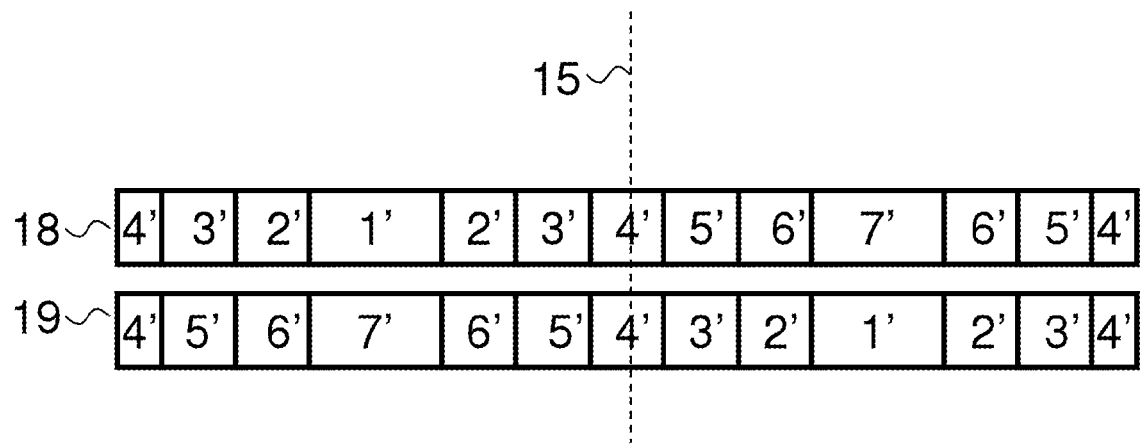
FIGS. 9a and 9b provide a comparison of k-space filling arrangements according to the prior art and an embodiment of the present invention.
Figure 9B:
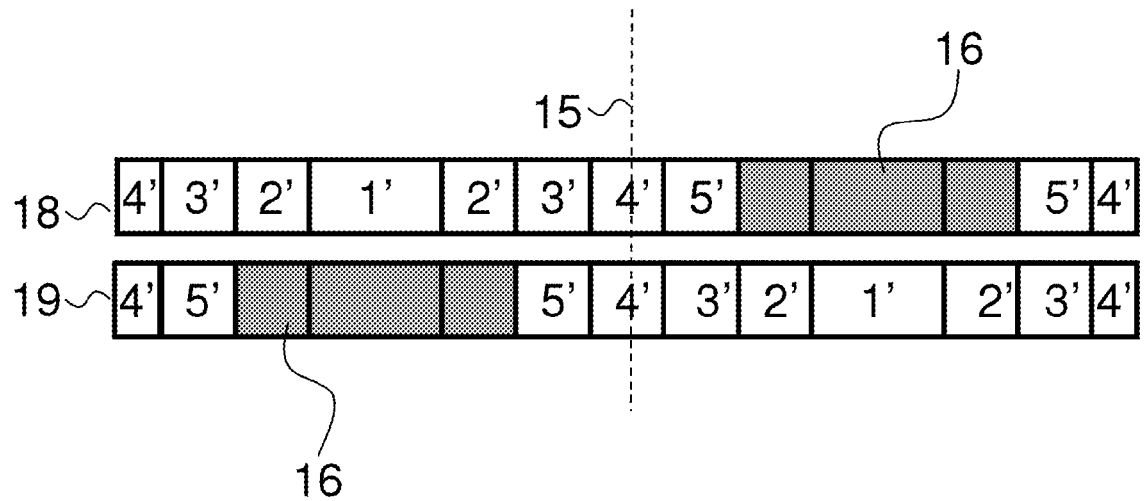
Figure 10:
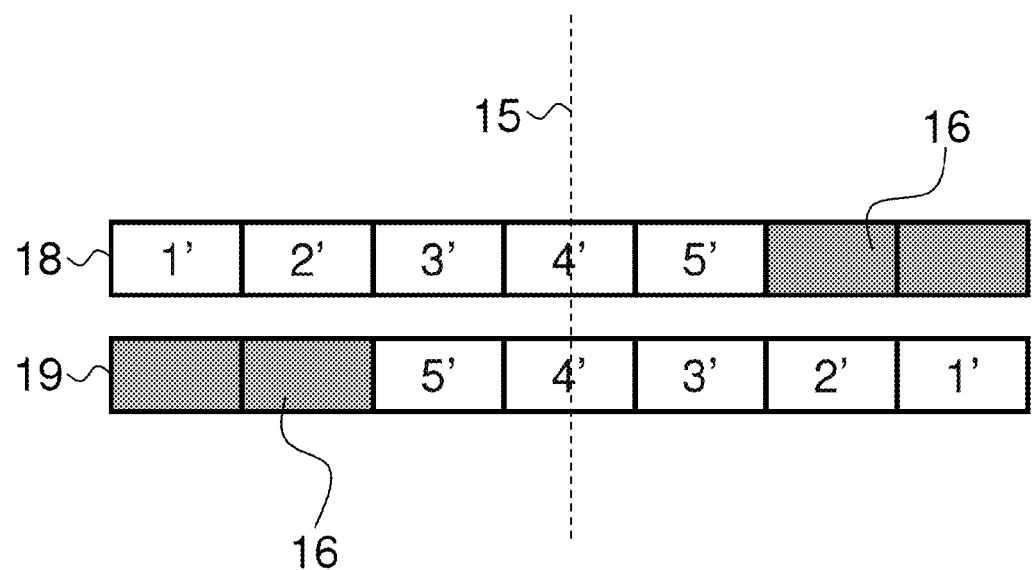
FIG. 10 shows a further example of k-space filling according to an embodiment of the present invention.

FIGS. 9b and 10 show the method of an embodiment of the present invention, in the particular exemplary embodiment in which two sets of signals 18 and 19 are acquired.

In this method, the received signals are entered into the two k-space matrices such that, in order to generate said single k-space matrix, a partial average is taken, in which the lower-intensity signals corresponding to the same phase-encoding gradient among the different sets of received signals are summed up and averaged, whereas the higher-intensity received signals are left unaveraged.

To do so, certain points of the k-space in the phase encoding directions are left unfilled 16 at each acquisition 18, 19, to form holes where the opposite acquisition had the higher-intensity echoes, such that the higher-intensity received signals 1' and 2', i.e. those belonging to the second subset, have no value corresponding thereto in the opposite acquisition, with which they should be averaged, and as such they are left unaveraged.

On the other hand, the lower-intensity signals 3', 4' and 5' of the acquisition 18 belonging to the first subset, are averaged with the lower-intensity signals 3', 4' and 5' of the acquisition 19, in the same positions of the phase encoding direction: The signal 4' of the acquisition 18 will be averaged with the signal 4' of the acquisition 19, the signal 3' of the acquisition 18 will be averaged with the signal 5' of the acquisition 19 and so on.

One or more intensity thresholds may be set, for discriminating the signals to be averaged from the signals to be left unaveraged.

The comparison between FIG. 9a and FIG. 9b shows that a smaller number of echoes are required to fill a k-space of the same size.

FIG. 9a corresponds to the average of the two signals as shown in FIG. 9, i.e. exhibits a sine-like arrangement.

Likewise, FIG. 9b describes a sine-like k-space filling arrangement, but according to the method of the present invention.

The imaging time was found to be reduced by 30-35%, e.g. from 4.35 to 3.10 minutes.

FIG. 10 shows an additional exemplary embodiment of k-space filling with a stepwise logic, where each received signal is placed adjacent to the previous one, in stepwise fashion.

During the acquisition 18, the signals are entered from left to right, and the last locations of the k-space 16 are left empty.

During the acquisition 19, the signals are entered from right to left, and the last locations of the k-space 16 are left empty.

This allows once again the lower-intensity signals 3', 4' and 5' to be averaged and the higher-intensity signals 1' and 2' to be left unaveraged.

In the present method, a multiplication factor is applied to each received signal to obtain a substantially constant noise for all received signals, once said partial average is taken.

Therefore in this case, a multiplication factor of $\sqrt{2}$ may be applied to the lower-intensity received signals or a multiplication factor of $$\frac{1}{\sqrt{2}}$$

may be applied to the higher-intensity received signals, or preferably the higher-intensity and lower-intensity signals are multiplied by multiplication factors that are optimized for noise equalization.

Figure 11:
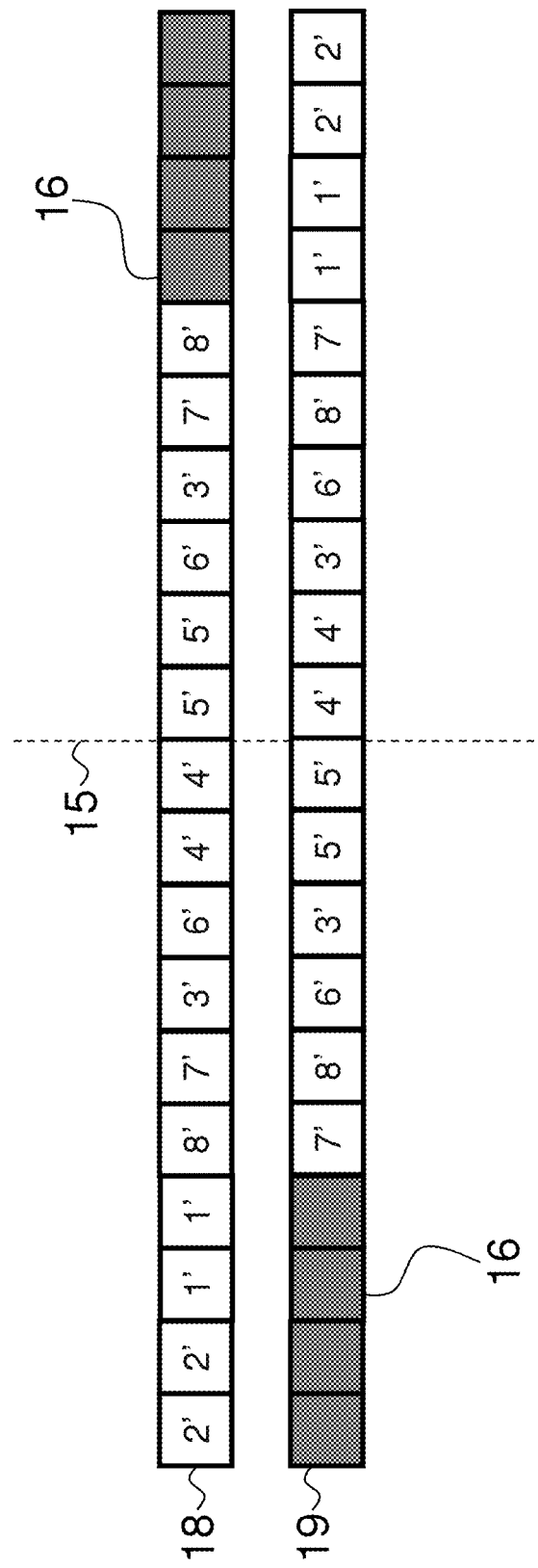
FIG. 11 shows a further example of k-space filling according to an embodiment of the present invention.

FIG. 11 shows an exemplary embodiment of a filling arrangement obtained by mixing the echoes at the center of the k-space.

In this case, the first subset of signals comprises the echoes 3', 4', 5', 6', 7' and 8', whereas the second subset comprises the echoes 1' and 2'.

This allows a uniform plateau to be formed at the center of the k-space, by mixing even and odd echoes.

As compared with the examples of the previous figures, additional echoes are entered, e.g. the echoes 7' and 8' and the TR is increased. This may be useful to optimize parameters for T2-weighted scanning.

The acquisition is also symmetrical, which allows PSF optimization.

While the above examples consider the acquisition of two sets of received signals, three or more sets of received signals may be obviously acquired.

In this case, the partial average involves an average of a preset number of received signals corresponding to the same phase-encoding gradient, which preset number of received signals changes according to the amplitude of each received signal and/or the position of each received signal in the k-space.

This means that the rules for averaging the signals corresponding to the same phase encoding may be changed as appropriate.

If n acquisitions are carried out, then subsets of received signals of the various sets of signals may be defined, which signals of each subset are left unaveraged or averaged together one or more times.

Figure 12:
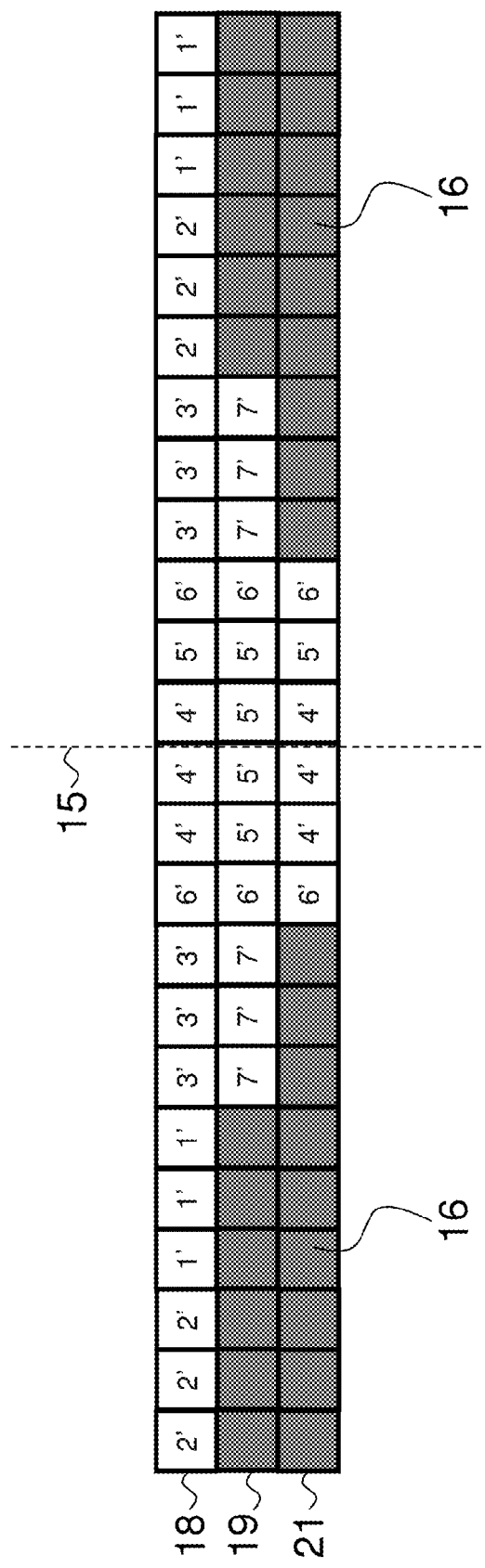
FIG. 12 shows a further example of k-space filling according to an embodiment of the present invention where three acquisitions are performed.

One exemplary embodiment of a three-acquisition filling arrangement is shown in FIG. 12, which clearly shows three different subsets: a first subset comprises the echoes 4', 5' and 6', a second subset comprises the echoes 3' and 7' and a third subset comprises the higher-intensity echoes 1' and 2'.

The echoes of the first subset are averaged multiple times, the echoes of the second subset are averaged once, whereas the echoes of the third subset are left unaveraged.

With 6 signals available for each echo, multiple arrangements and combinations are obviously possible, according to the desired result.

Such arrangements and combinations may be selected according to the average T2 selected to reduce blurring.

Figure 13A:
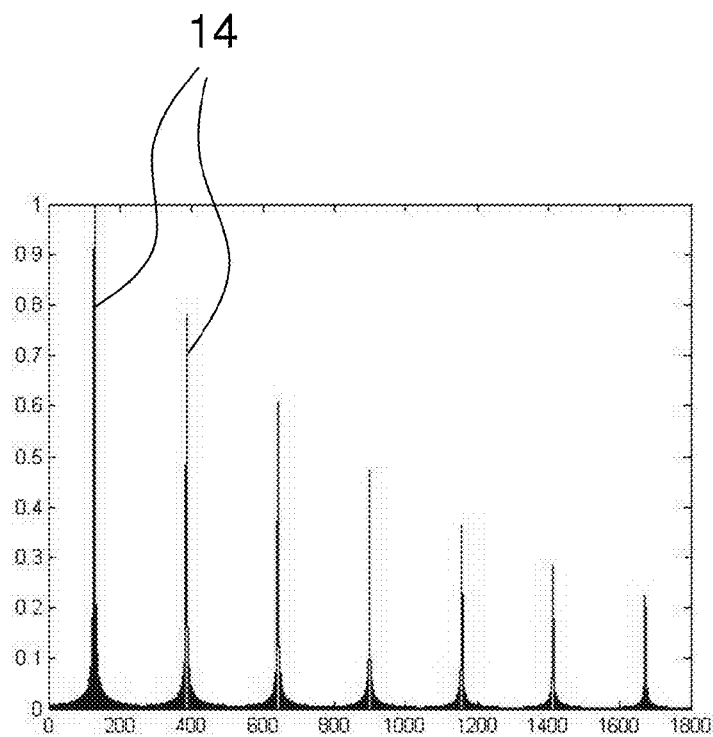
FIGS. 13a and 13b provide a comparison between an echo train as originally acquired and the same echo train after processing according to FIG. 12.
Figure 13B:
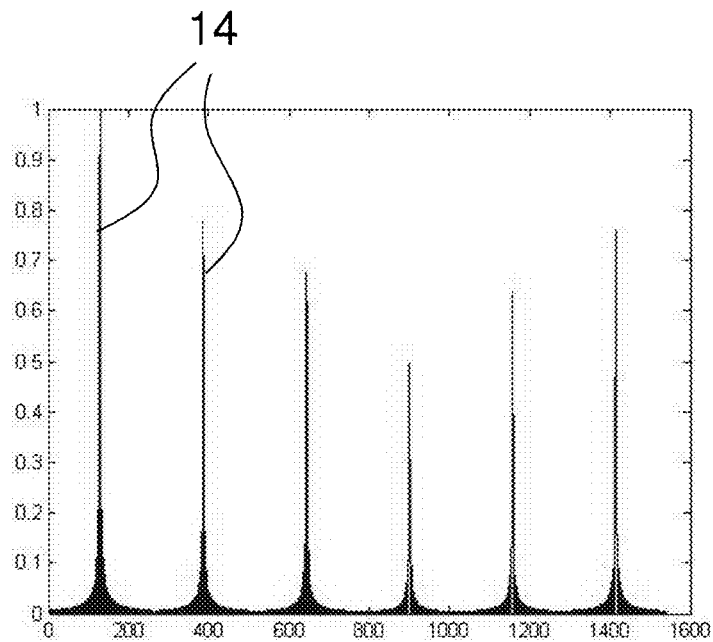

For this purpose, FIGS. 13a and 13b show a simulated echo train, with an average T2 of 80 ms, with the echo train as originally acquired compared with the same echo train after processing according to FIG. 12.

Once the average T2 for equalization and the number of acquisitions to be performed have been selected, the most convenient partial averages may be taken to reduce artifacts while trying to make the acquisition as symmetric as possible, to reduce the number of discontinuities and to reduce amplitude and phase differences among echoes in the k-space, by combining echoes with different parities and amplitudes.

Therefore, various different multiplication factors are applied to individual received signals or signals belonging to the same subset.

Also, a vector may be defined, which multiplies the signals after the FFT for each voxel, using a different multiplication factor for each component.

A multiplication factor may be determined according to the average T2 for each voxel.

The voxel for average T2 calculation is the one that incorporates the whole sample in the phase encoding direction.

The T2 may be obtained by acquisition of an additional TR, i.e. an additional excitation, without encoding.

The combination of signals that are averaged or left unaveraged may be also disposed in asymmetric fashion, e.g. to obtain wide signal plateaus.

Figure 14:
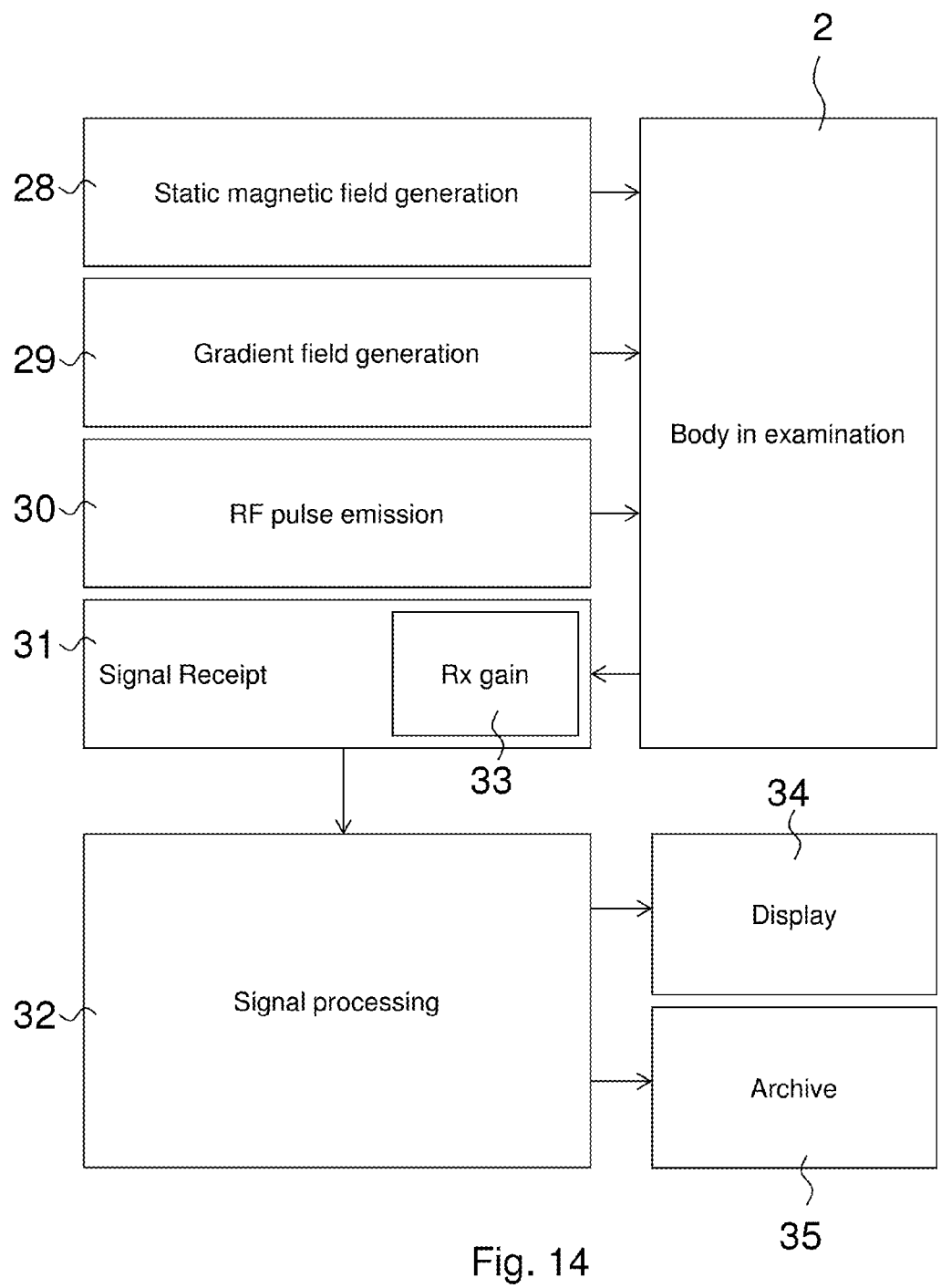
FIG. 14 is a diagrammatic view of an exemplary embodiment of the device of the present invention.

FIG. 14 is a diagrammatic view of an exemplary embodiment of the Magnetic Resonance Imaging device of the present invention.

The device comprises means for generating a static magnetic field 28, means for generating magnetic field gradients 29, means for transmitting radio-frequency excitation pulses 30, means for receiving the magnetic resonance signals emitted from the body under examination 31, means for processing such magnetic resonance signals emitted from the body under examination for generation of images 32.

The receiving means 31 acquire a first set 18 of received magnetic resonance signals corresponding to predetermined phase-encoding gradients and a second set 19 of received magnetic resonance signals, corresponding to further predetermined phase-encoding gradients from the body under examination, such that echoes with the same echo index are assigned to different phase-encoding gradients.

The first set 18 and the second set 19 are entered by the processing means 32 into two corresponding k-space matrices, and the two k-space matrices are combined into a single k-space matrix from which an image is generated by the means for processing the magnetic resonance signals emitted from the body under examination, for generating images 32.

The processing means 32 enter the received signals into said matrices so that, in order to generate said single k-space matrix, the processing means 32 take a partial average, wherein the lower-intensity received signals corresponding to the same phase-encoding gradient among the different sets of received signals 18 and 19 are summed up and averaged, whereas the higher-intensity received signals are left unaveraged.

The receiving means 31 include a pre-amplification unit 33 for applying a multiplication factor to the received signals.

The receiving means 31 apply a multiplication factor, varied for each received signal, to obtain a substantially constant noise for all received signals, once said partial average is taken.

Then, the images reconstructed from the k-space matrix so obtained are displayed on a screen 34 or stored in an archive 35.

Referring to FIGS. 15 to 26, the latter further show the differences between the prior art as described hereinbefore and the present invention, based on certain examples.

Figure 15:
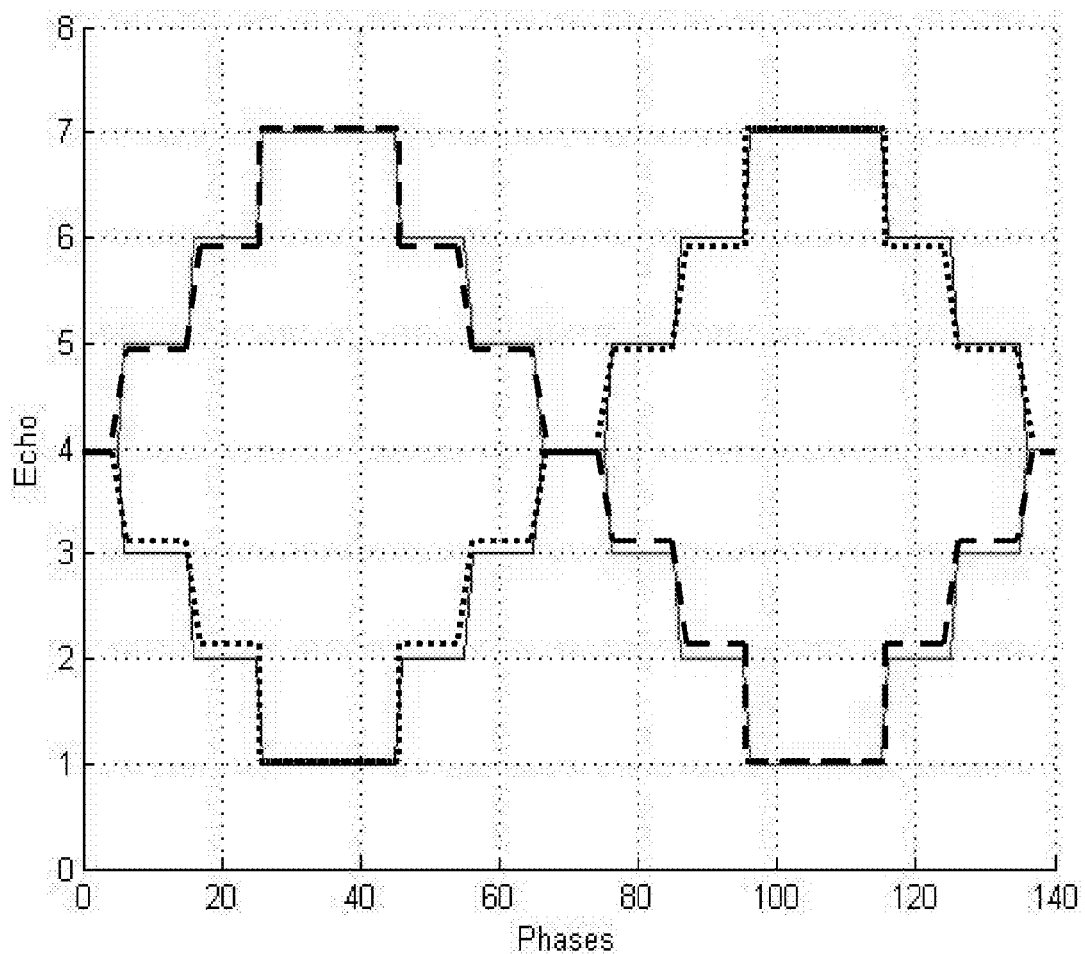
FIGS. 15 to 26 show further examples illustrating the differences between embodiments of the present invention and the prior art.

FIG. 15 show k-space filling charts of the prior art. Prior art k-space filling is performed with two sinusoids of opposite phases which are outlined in the figures by a dotted line and a dashed line. The x-axis indicates the phases and the y-axis indicates the echo number. The echo 5 is placed at the center of the space k, around about 70 phases.

Figure 16:
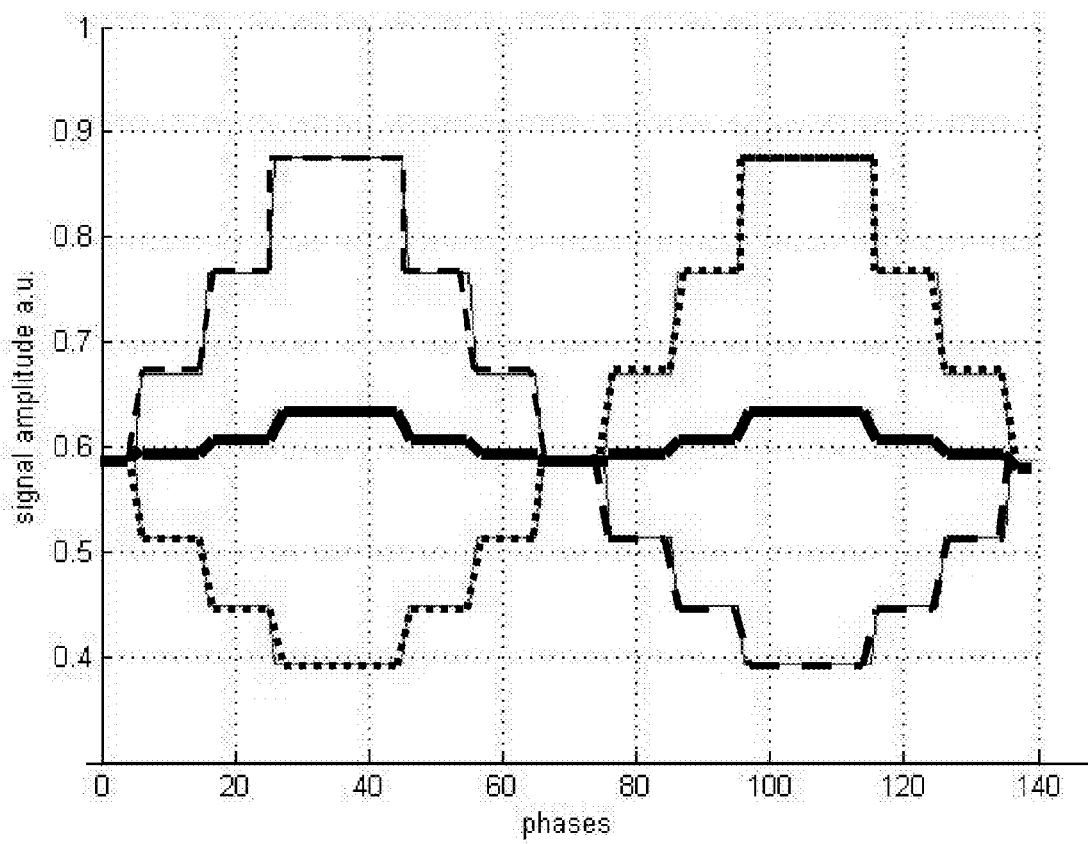

Assuming an ESP of 20 ms and a tissue with a T2=150 ms, which are typical values for clinical imaging, signal distribution in the k-space is the one as shown in FIG. 16.

The dotted line and the dashed line represent the signals of each acquisition, whereas the solid line represents the average of both acquisition. Signal distribution in the k-space is more uniform, which provides a better PSF.

Figure 17:
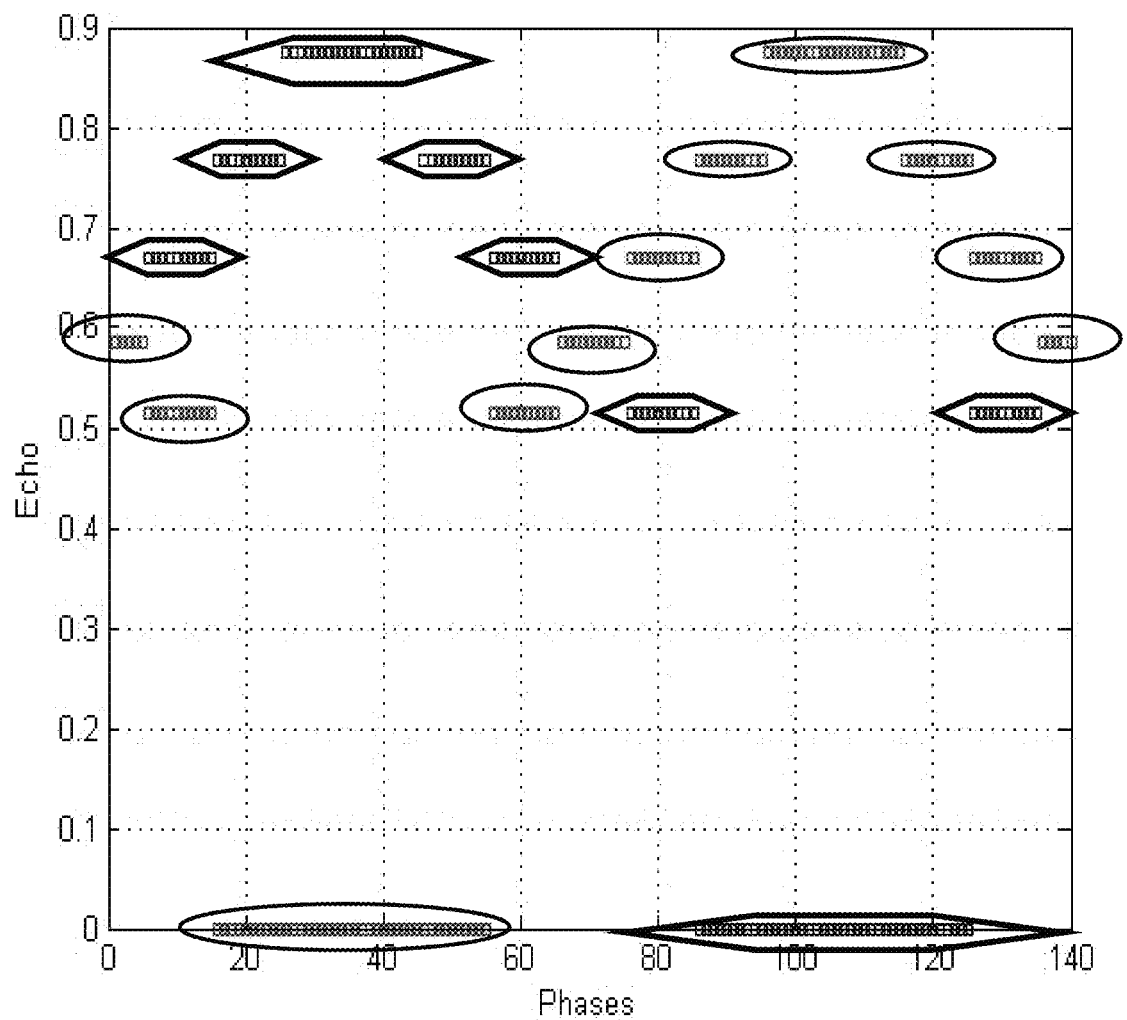
Figure 18:
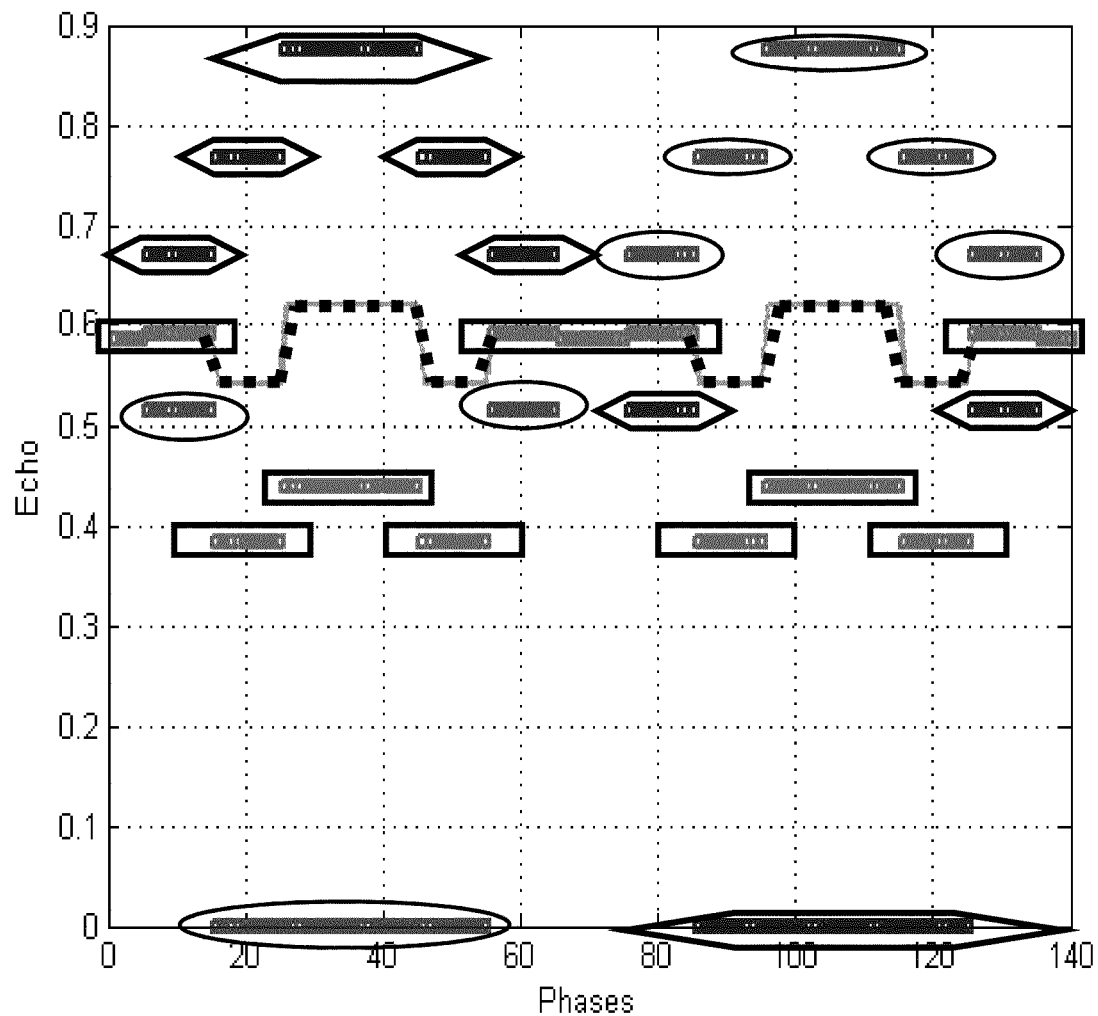
Figure 19:
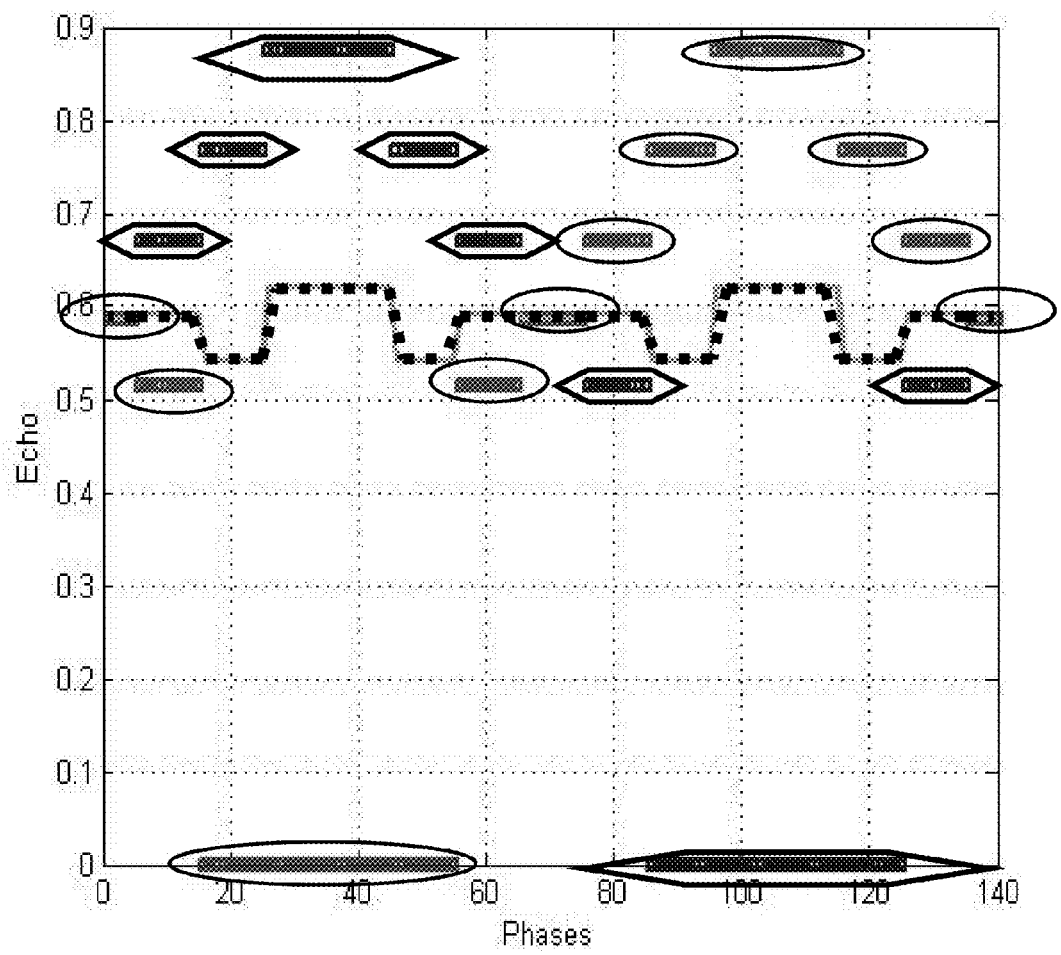

Considering the technique of the present invention, the echoes 6 and 7 are not acquired, whereby the distribution in k-space of FIGS. 17 to 19 is obtained.

With one of the two signals being higher, the other is not acquired. In the figures, since the graphic output of the apparatus identifies both signals with lines of different colors, not visible in B/W images, these two signals are differentiated by an ellipse and a hexagon respectively. Furthermore, in FIG. 18, the signal average is indicated by the rectangles and has a strong amplitude variation, whereas the dotted line represents the profile obtained by imposing an identical standard deviation of noise for each line of the k-space.

The chart of FIG. 19 is identical to that of FIG. 18, without the average signal identified by the rectangles.

Figure 20:
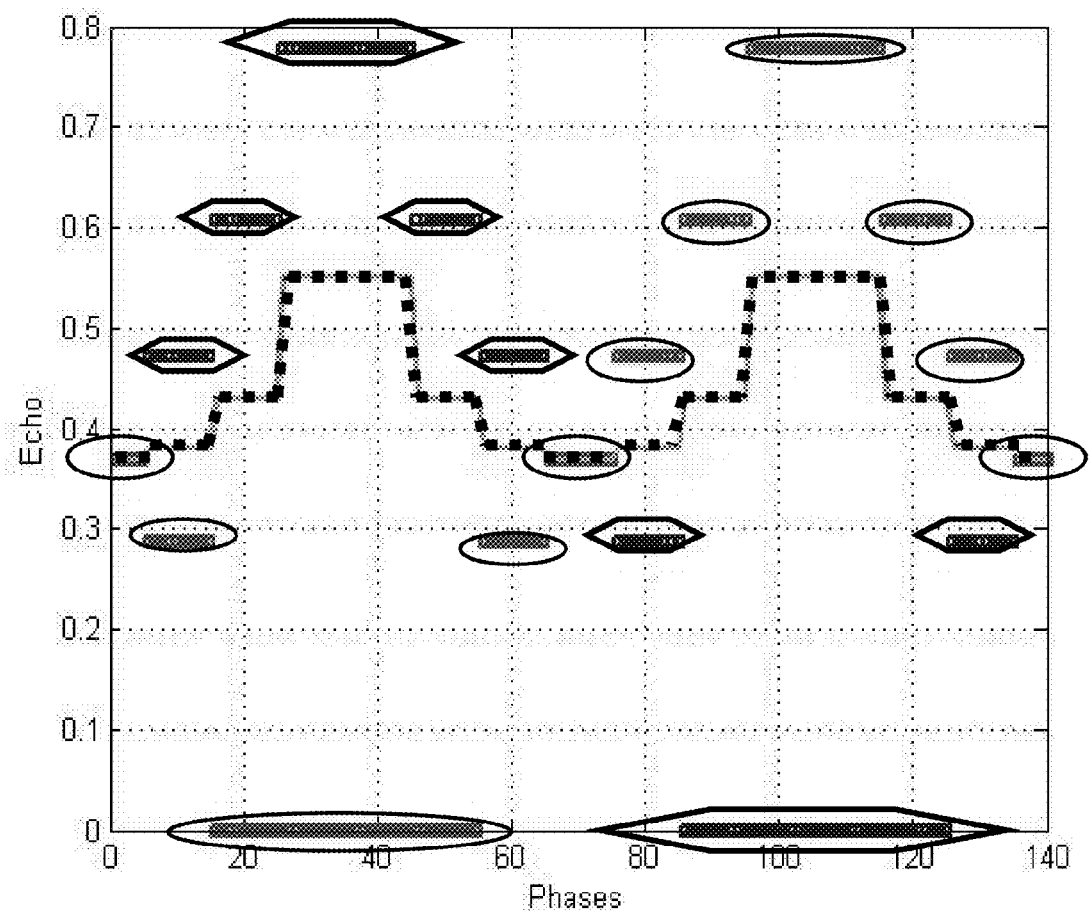

FIG. 20 shows a chart illustrating the distribution of the average signal in the k-space, like that of FIG. 19, but with a T2 value of 80 ms.

If the signal were to be multiplied by an ad hoc factor to minimize blurring, such value should be close to the noise equalizing factor and such factor will be greater or smaller according to the T2 value of the tissue for which blurring reduction is desired.

Figure 21:
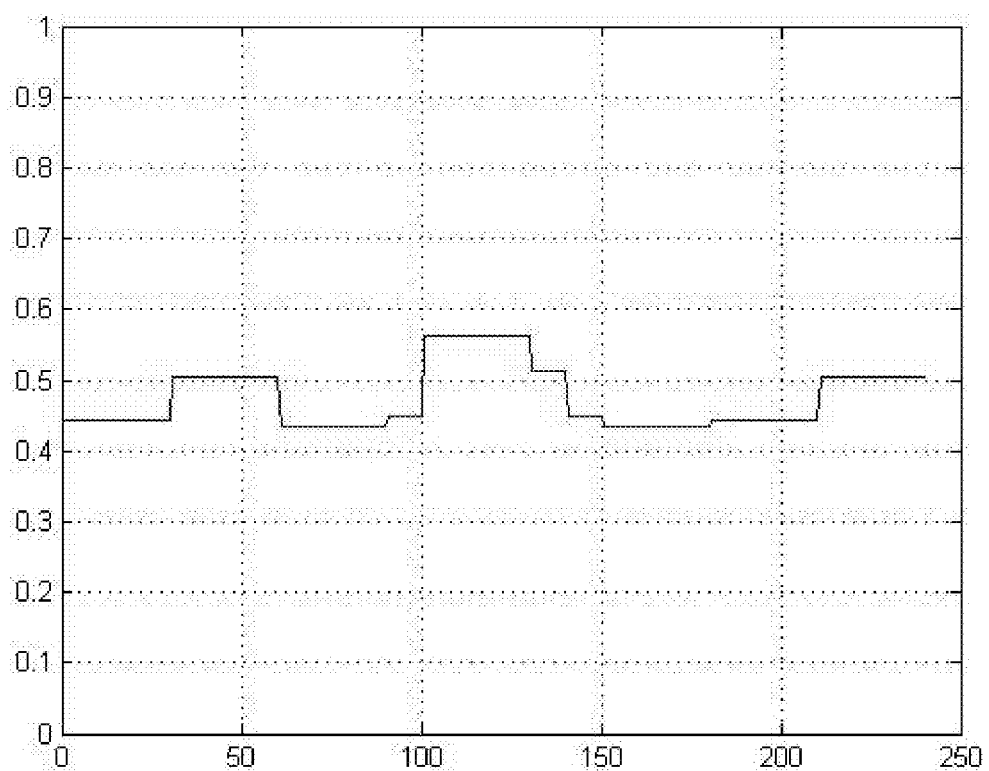

FIG. 21 shows signal intensity in the k-space, with reference to an acquisition scheme with three repetitions, as shown in FIG. 12.

Figure 22:
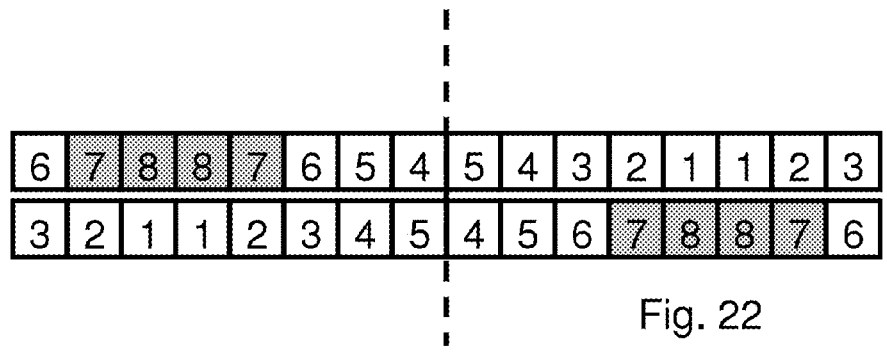

FIG. 22 shows an acquisition scheme with two preferred echoes and a sum of even and odd echoes. The center of the k-space is between echoes 5 and 4. The echoes have such a structure that the selected echoes (1 and 2) are aligned with the last echoes of the train (7 and 8) that are not scheduled.

Figure 23:
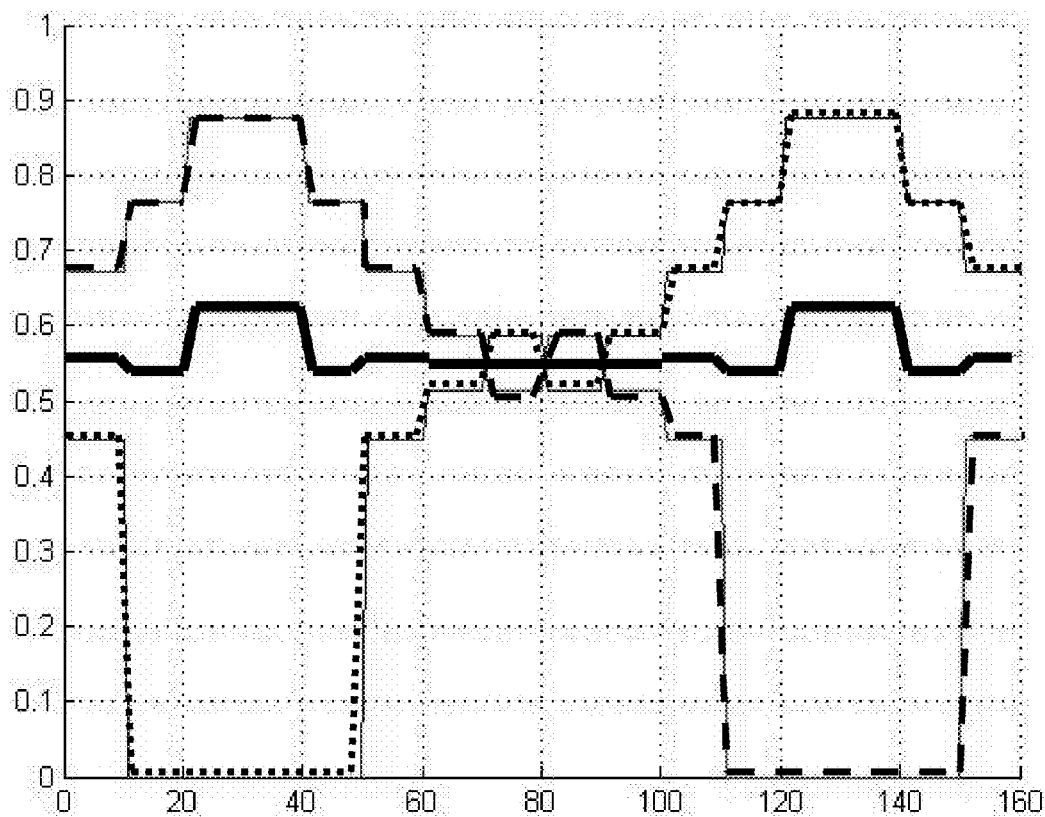

A signal distribution in the k-space with a T2 of 150 ms is shown in FIG. 23, like in the previous figures. The two signals are defined by the dotted line and the dashed line, whereas the average is the signal corresponding to the solid line.

Figure 24:
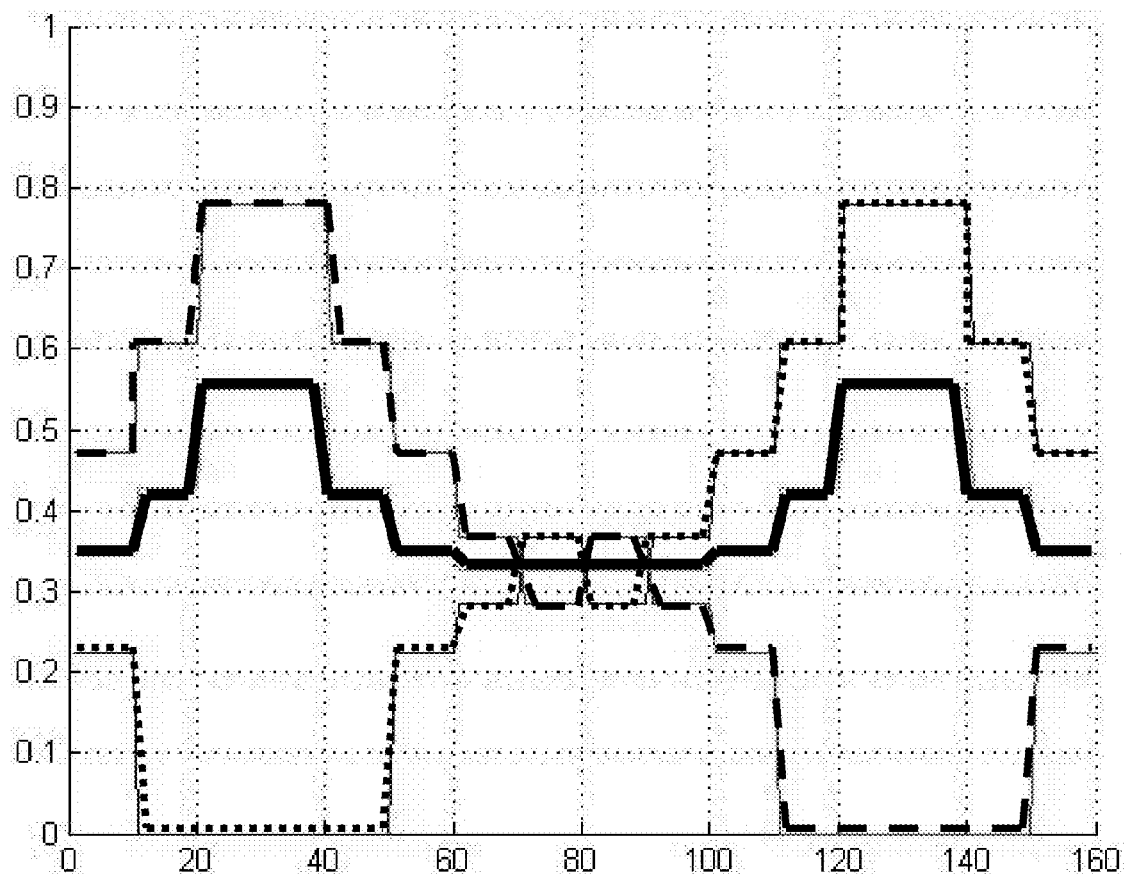

FIG. 24 shows a signal distribution in the k-space, with a T2 of 80 ms, with the same graphic arrangement as FIG. 23.

Figure 25:
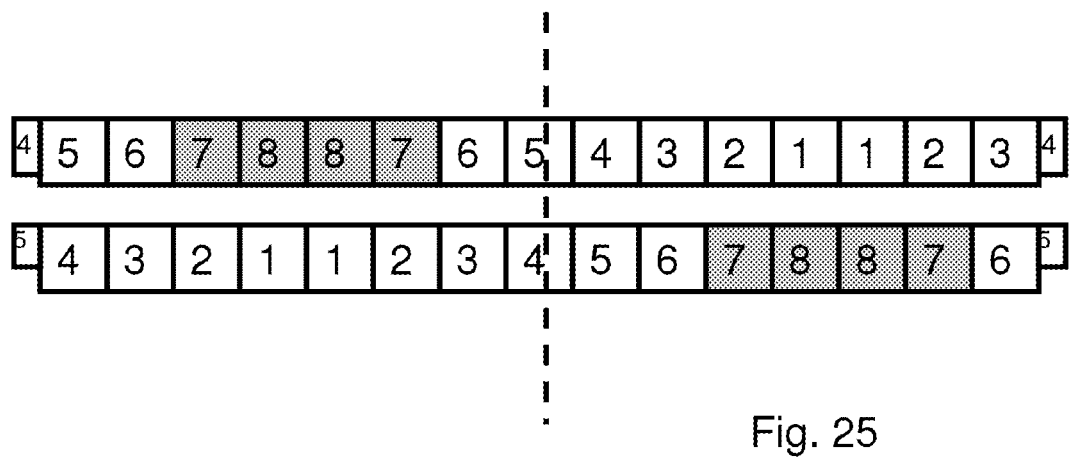

FIG. 25 shows an additional acquisition arrangement variant in which the even and odd echoes are mixed together. The echo at the center of the k-space is the average of the echoes 4 and 5. The selected echoes are the echoes 1 and 2 and the echoes that are not acquired are the echoes 7 and 8, which are indicated in gray color, line in the other figures.

Figure 26:
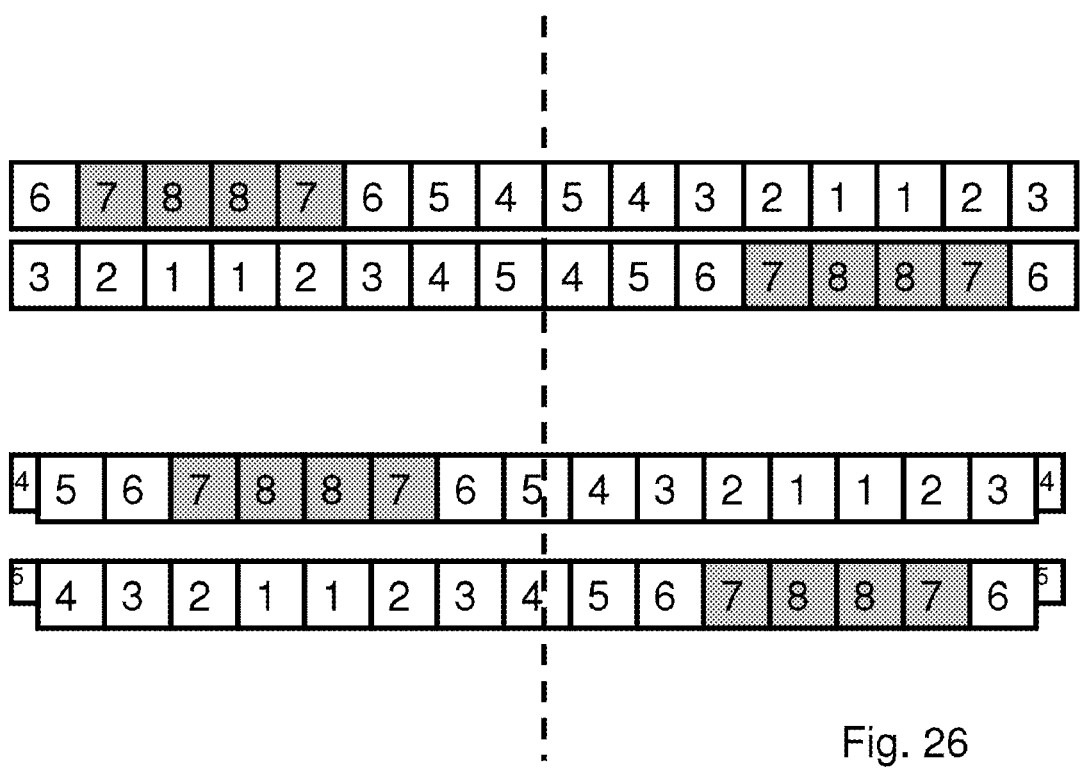

FIG. 26 shows a further strategy, consisting of a combination of the acquisition strategies of FIGS. 22 and 25.

The present invention may be embodied in many different forms. While illustrative embodiments of the invention have been described herein, the present invention is not limited to the various preferred embodiments described herein, but includes any and all embodiments having equivalent elements, modifications, omissions, combinations (e.g. of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to". The language "present invention" or "invention" should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example", and "NB" which means "note well".

The invention claimed is:

1. A Magnetic Resonance Imaging method comprising
an excitation and acquisition step, in which the body under examination is permeated by a static magnetic field, and in which excitation sequences comprising trains of radio-frequency pulses are applied to the body under examination by application of phase and frequency encoding gradients and magnetic resonance signals are received from the body under examination;
an image reconstruction step, in which said received magnetic resonance signals are processed for generating images by phase and frequency decoding, the images being acquired along section planes or slices of the body under examination, known as acquisition slices;
wherein a first set of magnetic resonance signals corresponding to predetermined phase-encoding gradients and at least one second set of received magnetic resonance signals, corresponding to further predetermined phase-encoding gradients, are acquired from the body under examination, using multi-echo sequences, such that echoes with the same echo index are assigned to different phase-encoding gradients,
said first set and said at least one second set being entered into at least two corresponding k-space matrices, and the at least two k-space matrices being combined into a single k-space matrix from which an image is generated,
wherein
each of the said at least two k-space matrices is incompletely filled such that, for the same phase encoding gradient, a first matrix of the matrices contains the higher-intensity received signals, and a second matrix of the matrices contains no signal at the positions in the second matrix corresponding to the position of the higher intensity received signals in the first matrix, and said single k-space matrix is generated by taking a partial average, where subsets of received signals corresponding to the same phase encoding gradients of the different sets of received signals are defined, and in at least one subset the received signals that correspond to the same phase encoding gradient of the different sets of received signals are not averaged or are averaged a smaller number of times, whereas in at least one further subset they are averaged a greater number of times and wherein a different multiplication factor is applied to each received signal to obtain a substantially constant noise for all received signals, once said partial average is taken.

2. The method as claimed in claim 1, wherein a first subset comprises lower-intensity received signals among the different sets of received signals, and a second subset comprises higher-intensity received signals of at least one of the different sets of received signals, and the received signals of the first subset of the different sets of received signals and corresponding to the same phase-encoding gradient are summed up and averaged, whereas the received signals of the second subset are not averaged and the highest intensity signal.

3. The method as claimed in claim 1, wherein said excitation sequences comprising trains of pulses are of Fast Spin Echo (FSE) type.

4. The method as claimed in claim 1, wherein the multiplication factor applied to said lower-intensity received signals is the reciprocal of a noise-reduction factor applied to said lower-intensity received signals after averaging, to reduce the noise intensity of the original received signals, which noise reduction is obtained by said partial average.

5. The method as claimed in claim 4, wherein the multiplication factor applied to said lower-intensity received signals is $\sqrt{n}$, where n is the number of received signals.

6. The method as claimed in claim 1, wherein the multiplication factor applied to said higher-intensity received signals is equal to a noise-reduction factor applied to the lower-intensity received signals after averaging, to reduce the noise intensity of the original received signals, which noise reduction is obtained by said partial average.

7. The method as claimed in claim 6, wherein the multiplication factor applied to said higher-intensity received signals is $$\frac{1}{\sqrt{n}},$$

where n is the number of received signals.

8. The method as claimed in claim 1, wherein said excitation sequences comprising trains of pulses are of Fast Spin Echo (FSE) type with T2 contrast.

9. The method as claimed in claim 1, wherein two sets of received signals are acquired.

10. The method as claimed in claim 1, wherein three or more sets of received signals are acquired, and wherein said partial average involves an average of a preset number of received signals corresponding to the same phase-encoding gradient, which preset number of received signals changes according to the amplitude of each received signal or the position of each received signal in the k-space.

11. The method as claimed in claim 1, wherein three or more sets of received signals are acquired, and wherein said partial average involves an average of a preset number of received signals corresponding to the same phase-encoding gradient, which preset number of received signals changes according to the amplitude of each received signal and the position of each received signal in the k-space.

12. A Magnetic Resonance Imaging device comprising:
a static magnetic field generator;
a magnetic field gradients generator;
a transmitter for transmitting radio-frequency excitation pulses;
a receiver for receiving magnetic resonance signals emitted from the body under examination;
a processing unit configured to process said magnetic resonance signals emitted from the body under examination to generate images;
wherein said receiver is configured to acquire a first set of magnetic resonance signals corresponding to predetermined phase-encoding gradients and at least one second set of received magnetic resonance signals, corresponding to further predetermined phase-encoding gradients from the body under examination, such that echoes with the same echo index are assigned to different phase-encoding gradients,
said first set and said at least one second set being processed by said processor unit and recorded into at least two corresponding k-space matrices, the processor unit combining the at least two k-space matrices into a single k-space matrix from which an image is generated,
wherein
the received signals are recorded by said processing unit into said matrices such that, for the same phase encoding gradients, a first matrix of the matrices contains the higher-intensity received signals and at least a second matrix of the matrices contains no signal at the positions in the second matrix corresponding to the position of the higher intensity received signals in the first matrix and, in order to generate said single k-space matrix, said processing unit computes a partial average, wherein the lower-intensity received signals corresponding to the same phase-encoding gradient among the different sets of received signals are summed up and averaged, whereas the higher-intensity received signals are left unaveraged, and in that said receiver applies a receiver gain varied for each received signal to obtain a substantially constant noise for all received signals, once said partial average is calculated.

* * * * *